United States Patent
Hasse et al.

(10) Patent No.: US 8,254,120 B2
(45) Date of Patent: Aug. 28, 2012

(54) ENCLOSURE ELEMENT

(75) Inventors: Dirk Hasse, Paderborn (DE); Dirk Bittner, Langenhagen (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 142 days.

(21) Appl. No.: 12/820,251

(22) Filed: Jun. 22, 2010

(65) Prior Publication Data

US 2010/0321886 A1 Dec. 23, 2010

(30) Foreign Application Priority Data

Jun. 22, 2009 (DE) .......................... 10 2009 030 088

(51) Int. Cl.
*H05K 7/20* (2006.01)
(52) U.S. Cl. .......................... 361/695; 361/690; 454/184
(58) Field of Classification Search ........................ None
See application file for complete search history.

(56) References Cited

U.S. PATENT DOCUMENTS

| | | | |
|---|---|---|---|
| 6,151,213 A | 11/2000 | Ater et al. | |
| 6,310,770 B1 * | 10/2001 | Negishi | 361/695 |
| 6,388,879 B1 * | 5/2002 | Otaguro et al. | 361/695 |
| 6,594,148 B1 | 7/2003 | Nguyen et al. | |
| 7,088,583 B2 * | 8/2006 | Brandon et al. | 361/694 |
| 7,152,418 B2 * | 12/2006 | Alappat et al. | 62/186 |
| 7,184,267 B2 * | 2/2007 | Patel | 361/692 |
| 7,215,552 B2 * | 5/2007 | Shipley et al. | 361/721 |
| 7,286,356 B2 * | 10/2007 | Keenan et al. | 361/700 |
| 7,316,606 B2 * | 1/2008 | Shipley et al. | 454/184 |
| 7,394,654 B2 * | 7/2008 | Zieman et al. | 361/695 |
| 7,688,593 B2 * | 3/2010 | Byers et al. | 361/721 |

(Continued)

FOREIGN PATENT DOCUMENTS

DE 85 10 847.2 7/1985

(Continued)

OTHER PUBLICATIONS

"Main Catalogue", Edition 23, 5. Desk-top cases, Schroff, 116 pages.

(Continued)

*Primary Examiner* — Boris Chervinsky
(74) *Attorney, Agent, or Firm* — Orrick Herrington & Sutcliffe, LLP

(57) ABSTRACT

An enclosure for electronic assemblies is provided, with a first deck surface and a first side wall with a short side and a long side and a second deck surface, disposed such that it faces the first deck surface, and a second side wall, disposed such that it faces the first side wall, with a short side and a long side, as well as with a first venting element, which extends in the direction of the long side along one of both side walls, and a plurality of plug-in slots for electronic assemblies that are arranged in parallel to one another, whereby the electronic assemblies are disposed, in the plugged-in state, vertically to both long sides of both side walls, and the first deck surface includes, along the end oriented toward the first side wall, a first opening and the first venting element, on the enclosure's outer side of the first deck surface, is disposed at least partially above the first opening, and the first and/or the second deck surface includes a second opening, along the end that faces the second side wall, for entering or exiting air, so that the venting element generates in the interior of the enclosure an air current that preferably flows vertically to the surface of the side walls.

9 Claims, 3 Drawing Sheets

U.S. PATENT DOCUMENTS

Figure 1A:
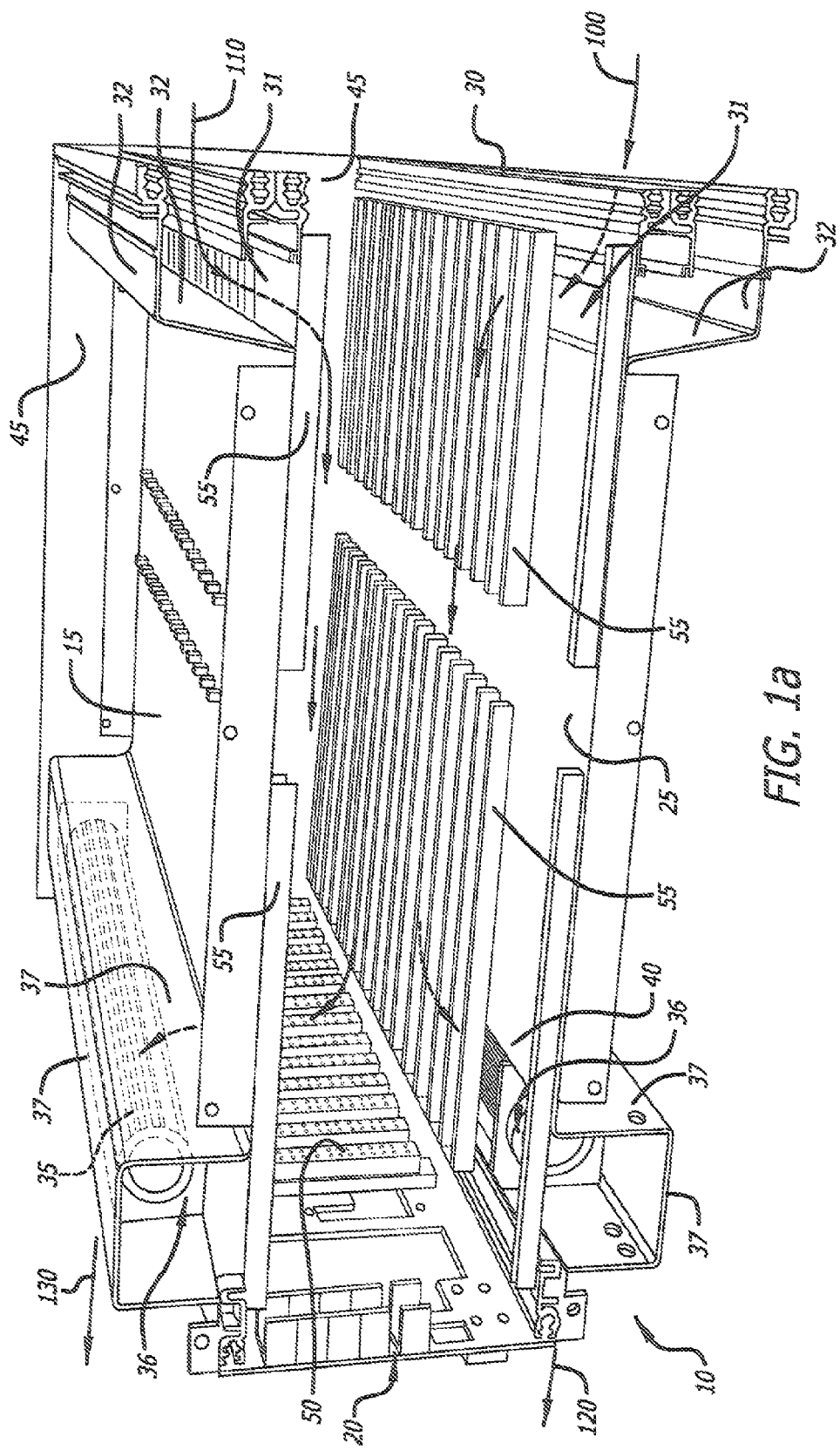

| | | | | |
|---|---|---|---|---|
| 7,751,189 | B2* | 7/2010 | Ahuja et al. | 361/697 |
| 7,804,684 | B1* | 9/2010 | Aybay et al. | 361/679.5 |
| 7,965,504 | B2* | 6/2011 | Hamlin | 361/695 |
| 8,064,200 | B1* | 11/2011 | West et al. | 361/695 |
| 2003/0151894 | A1* | 8/2003 | Singer | 361/695 |
| 2005/0276017 | A1* | 12/2005 | Aziz et al. | 361/695 |
| 2007/0030658 | A1 | 2/2007 | Norgard et al. | |
| 2007/0259616 | A1* | 11/2007 | Scattolin et al. | 454/184 |
| 2008/0233858 | A1* | 9/2008 | Womac et al. | 454/184 |

FOREIGN PATENT DOCUMENTS

| | | |
|---|---|---|
| DE | 202 16 758 U1 | 2/2003 |
| DE | 202 20 772 U1 | 6/2004 |
| JP | 2005-50989 A | 2/2005 |

OTHER PUBLICATIONS

"Crossflow Fans", Ziehl-Abegg GmbH & Co. KG, Zeppelinstraβe 28, D-74653 Kunzelsau, 28 pages.

"Fischer Elecktronik", 19" Plug-in fan trays 1U and 19" Cabinet cooler 3U, pp. N29 and N30 (2 pages).

"Main Catalogue", Edition 23—8, Systems, Schroff, Pentair Technical Products, 124 pages—Parts 1 and 2.

"Main Catalogue", Edition 23—4. Climate Control, Schroff, Pentair Technical Products, 50 pages.

"System Climate Control", We create the climate for productivity, Rittal, Friedhelm LOH Group, 98 pages.

"Rack-Mounted Fans", Enclosure Systems, Rittal SK, 3 pages.

"Packaging Solutions", Advanced TCA, Schroff, Pentair Technical Products, 88 pages, Parts 1 and 2.

"Electronic System Solutions", Everything an enclosure systems needs, Schroff, 16 pages.

"Next Generation AdvancedTCA", Schroff, White Paper-Next Generation Advanced TCA, 11 pages.

Rittal Products, Master data, Centrifugal fan (19 inch) SK 3144.000 Centrifugal fan (19 inch) 2 U air throughput 320 m3/h 230 V/50,60 Hz, 158 pages—Parts 1 and 2.

Rittal Products, Master data, Rack-mounted fan, SK 3350.115, 111 pages.

Schroff, 19" Electronic Cabinets, 19" Racks, electronic enclosures, 19" cases, AdvancedTCA, AdvancedMC, MicroTCA, CompactPCI, 19" chassis, subracks, 19" subracks, 19" plug-in unit-Schroff Ltd., 58 pages.

German Search Report dated May 4, 2010 (with English language machine translation).

* cited by examiner

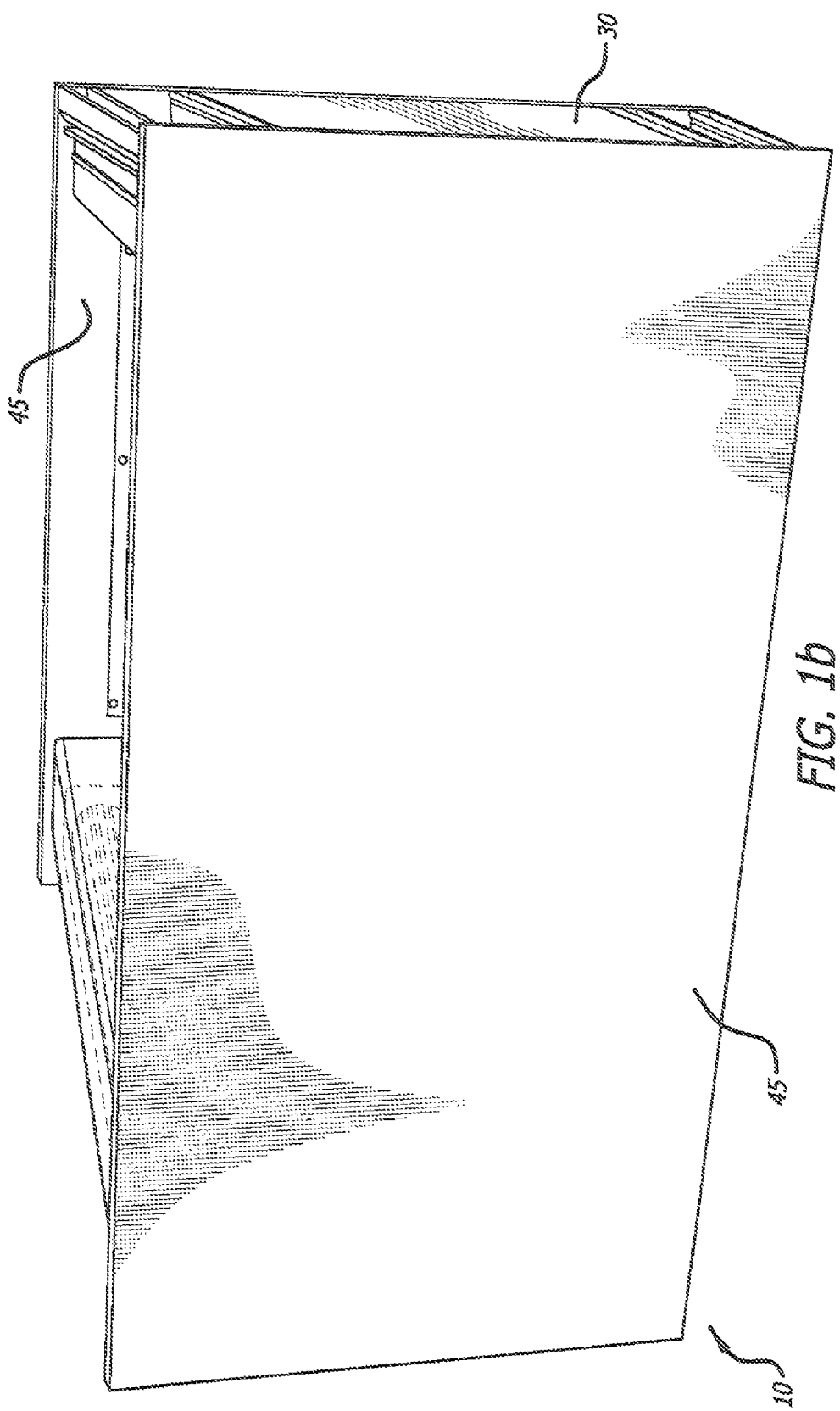

ENCLOSURE ELEMENT

RELATED APPLICATIONS

The present invention claims all rights of priority to German Patent Application No. 10 2009 030 088.0 filed on Jun. 22, 2009, which is hereby incorporated by reference.

DESCRIPTION

The present invention concerns an enclosure for electronic assemblies.

Enclosures for receiving electronic assemblies that encompass circuits implemented on printed circuit boards comprise generally a plurality of plug-in slots arranged in parallel for the reception of individual electronic assemblies. Such enclosures are typically offered in standardized dimensions, for example as so-called 19-inch slide-in enclosures. In the case where enclosures are equipped with heat-dissipating electronic assemblies one generally uses active venting elements subject to the use of radial cooling fans in order to avoid the overheating of electronic components and to assure ventilation. Studies utilizing such radial cooling fans have demonstrated that particularly in the case of an uneven placement, meaning if some heat-dissipating electronic assemblies are spaced less than others, individual assemblies are only insufficiently cooled because the main air current takes only the path of least resistance through the large gaps between the assemblies.

According to one aspect of the present invention, an enclosure for electronic assemblies is provided with a first deck surface and a first side wall with a short side and a long side and a second deck surface disposed such that it faces the first deck surface, and a second side wall disposed such that it faces the first side wall, with a short side and a long side, as well as with a first venting element, which extends in the direction of the long side along one of both side walls, and a plurality of plug-in slots for electronic assemblies that are arranged in parallel to one another, whereby the electronic assemblies are disposed, in the plugged-in state, vertically to both long sides of both side walls, and the first and/or the second deck surface includes, along the end oriented toward the first side wall, a first opening and the first venting element, on the enclosure's outer side, is disposed with one of both deck surfaces at least partially above the first opening, and the first and/or the second deck surface includes a second opening, along the end that faces the second side wall, for entering or exiting air. According to one aspect of the invention, the venting element is implemented such that it generates an air current that is generally evenly distributed over the entire width of the first opening, so that the electronic assemblies are generally evenly ventilated, independently of their plug-in position or of the distance to the next neighboring electronic assembly. In the interior of the enclosure the air current generated by the venting element flows for the most part vertically to the surface of the side walls. The venting element may comprise a tangent blower.

In accordance with one aspect of the invention, the arrangement of the venting element above one of the first opening on the outer side of the deck surface in the direct proximity of a side surface and with an entrance or exit for air again on the outside of the deck surface in direct proximity of the other side surface, respectively wide openings are made possible in the vicinity of the side surfaces. The air within the interior of the enclosure flows mainly in parallel to the deck surfaces. In the case of the side surfaces previously often used for the entrance and exit of air only small venting slits, among other things, can be implemented because of the receptacles for the electronic assemblies, whereby a higher flow resistance is created relative to the solution according to the invention. Radial cooling fans on the deck surfaces utilize the entire available surface, generate however an uneven air current vertically to the deck surfaces. Due to the fact that the venting elements or the openings stretch along both ends of the first and/or the second deck surface preferably along the entire length of the side panel, sufficient air current and cooling of the electronic assemblies is provided in the case of small distances between neighboring printed circuit boards. In accordance with one aspect of the invention, in order to achieve generally even air current even between the individual elements, it is contemplated to install the venting element as close as possible above or in front of the plug-in slots of the assembly elements. Tangential blowers may be employed because these generate an even air current over the entire width.

According to a further aspect of the invention, both deck surfaces include a first opening along the end that is facing the first side wall, whereby a second venting element is disposed on the outside of the enclosure of the second deck surface at least partially above the first opening. Use of venting elements on both deck surfaces can provide a particularly effective cooling of tightly grouped printed circuit boards. In this context venting elements may be employed that generate a generally even air current over the entire width. These can be, for example, tangential blowers. In this further aspect of the invention, also the air within the interior of the enclosure flows generally in parallel to the plugged-in printed circuit boards.

In accordance with another aspect of the invention, the first openings and/or the second openings may be implemented in the deck surfaces above the entire long side of the side walls and the first openings may be completely covered by the venting elements. The venting elements can transport the air in a direction that is generally parallel to the normal vector of the side wall. In accordance with another aspect of the invention, at least an air guide profile is disposed at a second opening in order to shape the entrance or exit of air above or below the second side wall, especially in a direction generally parallel to the normal vector of the side wall. Thus, the air guide profile can comprise, in a lateral view, a rectangular profile, or an oblique or a round profile. Furthermore combinations of the respective profile forms are possible. In this context an integral embodiment may be used in connection with the deck surfaces.

In accordance with another aspect of the invention, the enclosure may be implemented as a 19 inch slide-in enclosure. An enclosure for the reception of electronic assemblies in the form of circuits disposed on printed circuit boards generally encompasses three HE (height units). In the case that venting elements are disposed on the upper and the lower side, a total of five HE may be employed. The venting elements may be equipped with air guide profiles that are further described below.

In a further aspect of the invention, the enclosure includes cover plates on all sides in order to guide the air current in the interior of the enclosure as parallel as possible to the electronic assemblies.

Figure 2A:
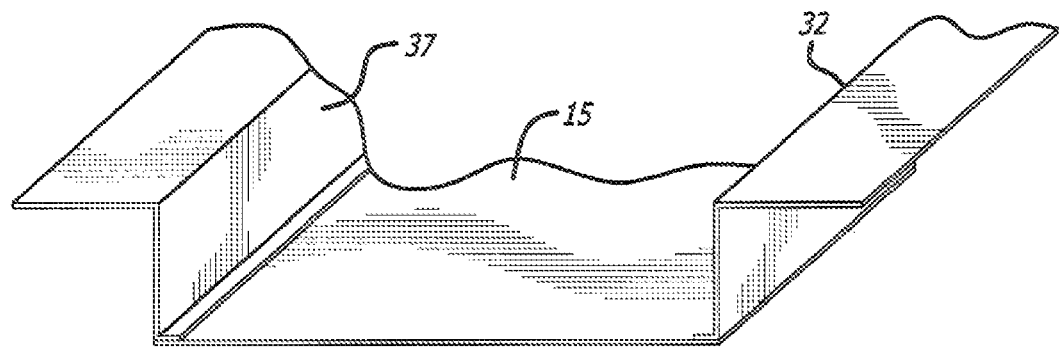
Figure 2B:
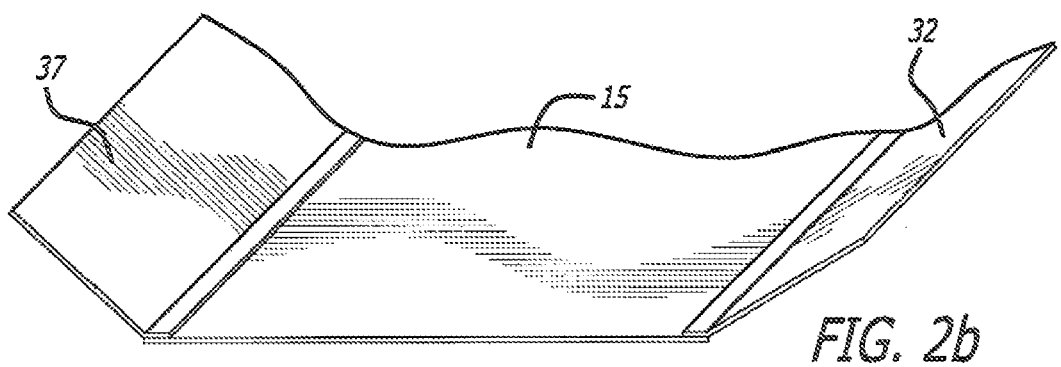
Figure 2C:
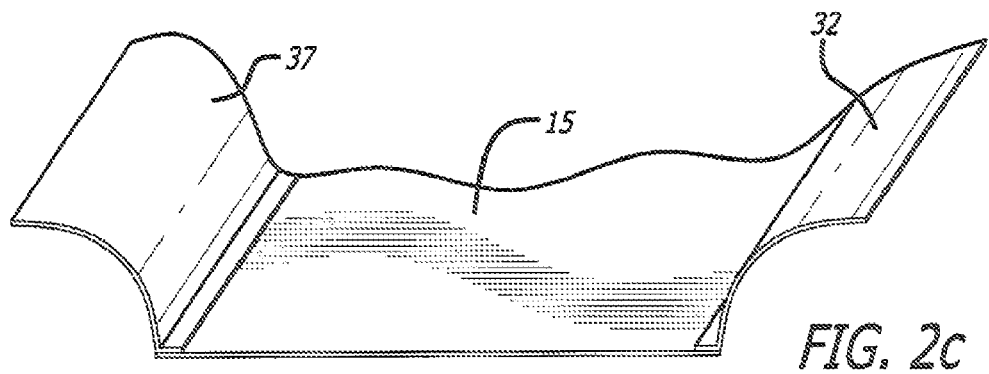

The enclosure according to the invention shall be explained in what follows based on the embodiment examples in connection with the schematized drawings. Functionally equivalent enclosure components are hereby labeled with the same reference symbols. The drawings show:

FIG. 1a and FIG. 1b an enclosure according to one aspect of the invention with two venting elements FIG. 2a a lateral view of a first embodiment of an air guide profile, FIG. 2b a lateral view of a second embodiment of an air guide profile, FIG. 2c a lateral view of a third embodiment of an air guide profile, The figure presents a schematized representation of an enclosure 10 according to one aspect of the invention, which is generally implemented as a 19-inch slide-in and may comprise metal, featuring a first deck surface 15 with a first opening (36) along the longitudinal side of the end that is facing the first side wall 20 and a second opening (31) along the longitudinal side of the end that is facing the second side wall 30, a second deck surface 25 with a first opening (36) along the longitudinal side of the end that is facing the first side wall 20 and a second opening (31) along the longitudinal side of the end facing the second side wall 30, each an air guide profile 32 over the second opening (31) of the first and the second deck surface 15, 25, a first venting unit 35 or second venting unit 40 disposed above the first opening (36) of the first deck surface 15 or the second deck surface 25, whereby the venting elements 35, 40 are respectively covered with an air guide profile 37, whereby the air guide profile 37 includes an opening along the longitudinal direction of the first side wall 20 for the purpose of drawing in of the air current into the enclosure or for the purpose of expelling the air current from the enclosure, a back wall 45, a front wall (not shown), a plurality of plug-in slots 50, disposed parallel to one another for the reception of electronic assemblies (not shown) in the form of electronic circuits preferably disposed on printed circuit boards. In order to increase the mechanical stability of the plugged-in electronic assemblies lateral guidance tracks 55 may be provided.

In what follows the functionality is explained. By means of the venting elements 35 and 40, which are laterally disposed on the deck surfaces 15 and 25, and their air guide profiles 37, which extend along the entire longitudinal direction of the first openings (36) of the side wall 20, and by means of the second openings 31, which are disposed respectively at the second end of the deck surfaces 15 and 25, and air guide profiles 32, which extend along the entire length of the second side wall 30, an air current is generated. The preferred direction of the air current is illustrated by means of the directional arrows 100, 110, 120, and 130, whereby in the interior of the enclosure 10 the air current flows generally parallel to the lateral guidance tracks 55. In this context it is contemplated to dispose the openings 36 exclusively beneath the venting elements 35, 40, whereby the openings can also comprise a slit-shaped implementation. Tangential blowers are suitable as blowers in the ventilation elements 35, 40. Tangential blowers distinguish themselves through a very even air mass transport over the entire width of the fan roller and include a low noise emission. The rotation direction of the fan roller is suitably chosen in order to generate the air current in the same direction. The parallelness of the air current is raised, in the assembled state, meaning with plugged-in electronic assemblies, by having the printed circuit boards themselves serve as air guide devices. Furthermore the parallelness of the air current is improved through the installation of the back wall 45 and the front wall, meaning on all sides of the enclosure 10 are cover plates disposed, whereby the cover plates can also include perforated plate-shaped recesses.

By arranging for the air entrance and air exit to be disposed on the upper side and lower side of the cover plates it is possible to provide sufficiently large openings and to cool sufficiently also in the case of a plurality of plugged-in printed circuit boards without having to dispose blowers in the interior of the enclosure. The capacity of the enclosure in regard to the reception of assembly groups is hereby increased. The enclosure 10 can be equipped with a plurality of printed circuit boards with minor spaces between neighboring printed circuit boards and here every printed circuit board can include heat dissipating electronic components. The danger of overheating may thus be significantly reduced.

Furthermore it is made possible by means of the air guide profiles 32, 37, which may comprise sheet metal or plastic, to guide the air current into the enclosure and again out. Hereby air can be drawn from the enclosure as well as blown into the enclosure. Due to the air guide profiles the height of the enclosure is admittedly raised from for example 3 height units (3 HE) to up to 5 HE, however one can stack, as a result of the horizontal air mass transport, any number of enclosures without that the cooling characteristics of the enclosures would effect one another as it would be the case with enclosures for which the ventilation of the electronic assemblies is implemented vertically to the deck plates.

Embodiments of the air guide profiles are shown schematically in FIGS. 2a to 2b. According to the illustration of FIG. 2a the air guide profiles are implemented rectangular, according to the illustration of FIG. 2b oblique, and according to the illustration of FIG. 2c rounded off. Additional embodiments, such as combinations of the represented shapes, are also contemplated such that the air guide profiles can guide the air current into the interior of the enclosure or out of it. Particularly in the case of 19-inch slide-in construction types are the air guide profiles advantageously utilized in order not to draw air from neighboring slide-ins or to blow the released warm air from the enclosure to be ventilated into them. Furthermore the air guide profiles can, besides the illustrated embodiments, also be implemented integrally formed with the deck plates.

The invention claimed is:

1. An enclosure for electronic assemblies comprising:
 a first deck surface,
 a first side wall with a short side and a long side,
 a second deck surface, disposed such that it faces the first deck surface,
 a second side wall, disposed such that it faces the first side wall, with a short side and a long side, such that the surfaces of the first deck surface, the first side wall, the second deck surface and the second side wall define an interior of the enclosure,
 a first venting element, which extends in the direction of the long side of the side walls, and
 a plurality of plug-in slots for electronic assemblies that are arranged on the first side wall in parallel to one another, where the slots are capable of connecting to electronic assemblies arranged perpendicular to the surface of the side wall,
 wherein the first deck surface includes, along the end that is adjacent the first side wall, a first opening and the first venting element is substantially outside the interior of the enclosure and adjacent to the first opening of the first deck surface, so as to be capable of venting air through the first opening, and the first deck surface or the second deck surface has a second air opening along the end that is adjacent to the second side wall, so as to create a possible path for air in the interior of the enclosure from the venting element to the second air opening.

2. An enclosure according to claim 1, wherein the second deck surface includes a first opening of the second deck surface along the end that is adjacent to the first side wall and a second venting element is disposed substantially outside the interior of the enclosure and adjacent to the first opening of the second deck surface.

3. An enclosure according to claim 1, wherein the venting elements comprise tangential blowers.

4. An enclosure according to claim 1, wherein the venting elements are each covered with an air guide profile, the air guide profile having an opening along the long side of the side wall for drawing the air current into the enclosure or for discharging the air current from the enclosure.

5. An enclosure according to claim 1, wherein an air guide profile is disposed above at least one deck surface second opening in order to shape air flow.

6. An enclosure according to claim 4, wherein the air guide profiles comprise a rectangular, oblique or rounded off profile.

7. An enclosure according to claim 1, wherein the enclosure comprises a 19-inch slide-in enclosure.

8. An enclosure according to claim 1, wherein the enclosure includes cover plates on all sides.

9. An enclosure according to claim 1, wherein one or more of the deck surface openings extend along generally the entire length of the side walls.

* * * * *